(12) United States Patent
Roters et al.

(10) Patent No.: US 7,151,060 B2
(45) Date of Patent: Dec. 19, 2006

(54) DEVICE AND METHOD FOR THERMALLY TREATING SEMICONDUCTOR WAFERS

(75) Inventors: Georg Roters, Dülmen (DE); Steffen Frigge, Chemnitz (DE); Sing Pin Tay, Fremont, CA (US); Yao Zhi Hu, San Jose, CA (US); Regina Hayn, Bernsdorf (DE); Jens-Uwe Sachse, Dresden (DE); Erwin Schoer, Catania (IT); Wilhelm Kegel, Langebrück (DE)

(73) Assignee: Mattson Thermal Products GmbH, Dornstadt (DE)

( * ) Notice: Subject to any disclaimer, the term of this patent is extended or adjusted under 35 U.S.C. 154(b) by 0 days.

(21) Appl. No.: 10/524,871

(22) PCT Filed: Jul. 25, 2003

(86) PCT No.: PCT/EP03/08220

§ 371 (c)(1),
(2), (4) Date: Aug. 15, 2005

(87) PCT Pub. No.: WO2004/023529

PCT Pub. Date: Mar. 18, 2004

(65) Prior Publication Data

US 2006/0105584 A1 May 18, 2006

(30) Foreign Application Priority Data

Aug. 12, 2002 (DE) .............................. 102 36 896

(51) Int. Cl.
*H01L 21/324* (2006.01)
*H01L 21/477* (2006.01)
*H01L 21/42* (2006.01)
*H01L 21/26* (2006.01)

(52) U.S. Cl. .................. 438/795; 438/796; 438/660; 438/773; 438/471; 118/50.1; 118/725; 392/407; 392/411; 392/412; 392/416; 257/E21.001

(58) Field of Classification Search ............... 438/795, 438/796, 660, 773, 471; 392/407, 411, 412, 392/416; 118/50.1, 725
See application file for complete search history.

(56) References Cited

U.S. PATENT DOCUMENTS 5,861,609 A * 1/1999 Kaltenbrunner et al. .... 219/390

(Continued)

FOREIGN PATENT DOCUMENTS

DE 44 37 361 4/1996

(Continued)

*Primary Examiner*—Michael Lebentritt
*Assistant Examiner*—Mohsen Ahmadi
(74) *Attorney, Agent, or Firm*—Dority & Manning, P.A.

(57) ABSTRACT

A device for thermally treating semiconductor wafers having at least one silicon layer to be oxidized and a metal layer, preferably a tungsten layer, which is not to be oxidized. The inventive device comprises the following: at least one radiation source; a treatment chamber receiving the substrate, with at least one wall part located adjacent to the radiation sources and which is substantially transparent for the radiation of said radiation source; and at least one cover plate between the substrate and the wall part of the treatment chamber located adjacent to the radiation sources, the dimensions of said cover plate being selected such that it fully covers the transparent wall part of the treatment chamber in relation to the substrate in order to prevent material, comprising a metal, metal oxide or metal hydroxide such as tungsten, tungsten oxide or tungsten hydroxide, from said substrate from becoming deposited on or evaporating onto the transparent wall part of the treatment chamber.

34 Claims, 5 Drawing Sheets

U.S. PATENT DOCUMENTS

| | | | |
|---|---|---|---|
| 5,872,889 A * | 2/1999 | Kaltenbrunner et al. | 392/418 |
| 6,197,702 B1 | 3/2001 | Tanabe et al. | |
| 6,228,752 B1 | 5/2001 | Miyano | |
| 6,245,605 B1 | 6/2001 | Hwang et al. | |
| 2001/0014522 A1 | 8/2001 | Weimer et al. | |

FOREIGN PATENT DOCUMENTS

| | | |
|---|---|---|
| DE | 100 60 628 | 1/2002 |
| DE | 10060628 * | 1/2002 |
| DE | 101 20 523 | 10/2002 |
| EP | 0 116 317 | 8/1984 |
| JP | 08031761 | 2/1996 |
| JP | 09306860 A * | 5/1996 |
| JP | 09306860 | 11/1997 |
| WO | WO 01/82350 | 11/2001 |
| WO | WO 01/82350 A1 * | 11/2001 |
| WO | WO02/089190 | 11/2002 |

* cited by examiner

DEVICE AND METHOD FOR THERMALLY TREATING SEMICONDUCTOR WAFERS

BACKGROUND OF THE INVENTION

This invention relates to a device and a method for thermally treating semiconductor wafers having at least one silicon layer to be oxidized and a metal layer, preferably a tungsten layer, which is not to be oxidized.

In the semiconductor industry there is increasingly the necessity to design semiconductor elements which are smaller and more efficient. An example of this is the increasing use of tungsten instead of tungsten silicide as a component part of the gate assembly in MOS transistors. The use of tungsten as the gate material is advantageous due to the low specific resistance of tungsten compared to tungsten silicide. This makes it possible to reduce the resistance of the gate, and this leads to improved electrical performance of the transistors. Moreover, the height of a gate stack can be considerably reduced by the use of tungsten in contrast to tungsten silicide, and this leads to a substantial simplification in the following filling and etch steps because the aspect ratio (ratio of height to the distance of the stack) is smaller.

A gate stack of this type is generally formed on a silicon substrate, whereby first of all a gate oxide layer, a polycrystalline silicon layer, a tungsten nitride layer, a tungsten layer and a silicon nitride layer are applied.

Subsequently, for defining individual gate areas, selective etch is carried out, whereby the cauterized side walls of the gate stack are open. After the etch there follows a gate stack side wall oxidation which serves to mend or heal etch damage and reduce the leakage currents. When using a tungsten gate, this process must be selective, i.e. whereas the polycrystalline silicon layer has to be oxidized, the tungsten must not be oxidized because the formation of a high-resistance tungsten oxide prevents the electrical functionality of the gate.

Selective oxidation of this type can be achieved by wet oxidation in hydrogen-rich atmospheres within a fast heating unit or a rapid thermal processing (RTP) unit.

An RTP unit which can generally be used here is, for example, shown in DE 44 37 361 going back to the applicant.

With the known RTP unit, the wafer to be treated is received in a quartz chamber and is heated by banks of lamps located above and below the quartz chamber. In so doing, it is known to place a thermally stable and geometrically similar light-absorbing plate in the quartz chamber, and in such a way that the wafer is heated by a radiative and convective energy coupling between the plate and the wafer, instead of being heated directly by the lamps. The advantage of this is that the light-absorbing plate is thermally stable and maintains constant emissivity, by means of which exact temperature control of the semiconductor wafer is possible, even if the emissivity of the semiconductor disc is varied. For details with regard to the use of a light-absorbing plate, reference is made to DE 44 37 361 so as to avoid repetitions.

With the process described above for the selective side wall oxidation, there is, however, the problem that compounds containing tungsten, in particular tungsten oxide, can evaporate from the semiconductor wafer. This type of evaporation of the tungsten oxide or of a metal oxide or metal hydroxide is deposited on the quartz chamber, is reduced there to tungsten or to metal and by partial shading of the radiation from the lamps, affects the temperature distribution over the wafer and/or over the light-absorbing plate and so also over the wafer. With several processes following on from one another, due to stronger and stronger shading processes, substantial changes can be made to the process parameters, such as e.g. the process temperature and the wafer temperature.

The aim of this invention, therefore, is to create a device and a method for thermally treating semiconductor wafers, whereby the process conditions which substantially remain the same, make it possible with selective oxidation of a silicon layer to be oxidized and of a metal layer, preferably a tungsten layer, not to be oxidized.

SUMMARY OF THE INVENTION

In accordance with the invention, this problem is solved with a device for thermally treating semiconductor wafers having at least one silicon layer to be oxidized by providing at least one radiation source, a treatment chamber receiving the substrate, with at least one wall part located adjacent to the radiation sources and which is substantially transparent for the radiation of said radiation source, and at least one cover plate between the substrate and the transparent wall part of the treatment chamber located adjacent to the radiation sources, the dimensions of the cover plate being such that it fully covers the transparent wall part of the treatment chamber in relation to the substrate in order to prevent material comprising a metal, a metal oxide or a metal hydroxide, such as e.g. tungsten, tungsten oxide or tungsten hydroxide from said substrate from becoming deposited on or evaporating onto the transparent wall part of the treatment chamber.

Material, which can comprise metals such as e.g. tungsten, which evaporates from the semiconductor wafer, collects on the cover plate and so prevents it from collecting on the transparent wall part of the treatment chamber, and this prevents deterioration of the process ratios over several process cycles.

In accordance with a particularly preferred embodiment of the invention, the cover plate for the radiation of the radiation source is substantially non-transparent so that material such as e.g. tungsten, tungsten oxide or tungsten hydroxide deposited on the cover plate due to the optical non-transparency of the plate has no effect upon the temperature distribution of the wafer. With non-transparent cover plates there is no direct heating of the wafer via the radiation source, rather heating is indirect via the cover plate.

In order to be able to remove the cover plate easily, for example for the purpose of cleaning, the cover plate preferably rests loosely on corresponding holding elements in the treatment chamber. This is particularly advantageous with transparent cover plates because the same must be cleaned frequently of the deposits collecting here from the material released from the semiconductor wafer so as to maintain unchanging process conditions. But also with non-transparent cover plates it can be advantageous to carry out regular cleaning of the same, e.g. due to the tungsten collecting here, so as to e.g. minimize any contamination of the process chamber and so as to guarantee reproducible processing of the semiconductor wafer.

Preferably, a handling device is provided for the automatic removal and insertion of the cover plate from and into the treatment chamber so as to make it possible, for example, to change plates automatically between subsequent treatment processes, and without seriously delaying subsequent treatment processes because of said change. For this, the handling device is preferably only in contact with the cover plate on a surface facing away from the substrate, so as to avoid contaminating the handling device with material released from the semiconductor wafer, such as e.g. with tungsten, tungsten or metal oxide, or tungsten or metal hydroxide. This is particularly advantageous if the handling device is also used for loading and unloading substrates.

Advantageously, at least one cover plate is provided above and below the substrate, i.e. on both sides of the substrate so as to receive evaporating material such as e.g. tungsten as completely as possible.

In order to set the process parameters appropriately, different cover plates are preferably provided above and below the substrate.

Preferably, the surface of the cover plate facing the substrate is coated, whereby the coating, on the one hand, may enable good adhesion of the material released from the semiconductor wafer, such as e.g. the tungsten and its compounds, and on the other hand, for example, may be made from a material which is easy to clean.

With another preferred embodiment of the invention, a light-absorbing plate is provided between the cover plate and the transparent wall part of the treatment chamber which makes possible good light absorption and so also indirect heating of the wafer. The light-absorbing plate can be small and of a form which substantially corresponds to the geometry of the semiconductor wafer, because the light absorbing plate does not serve to catch material evaporating or material released from the wafer, such as e.g. tungsten. With one embodiment of the invention, the cover plate is made from glass, in particular quartz glass, which on the one hand is cheap to produce, and on the other hand is easy to clean, and can also be easily and cheaply coated with, e.g. a silicon nitride, a silicon oxy-nitride or a silicon oxide layer.

With a particularly preferred embodiment of the invention, a device is provided for the introduction of a non-watery, i.e. water-free or water-vapor free, hydrogen-containing process gas into the treatment chamber because this type of process gas makes selective oxidation possible, in particular when in addition, during the introduction and/or before or after the introduction of the water-free process gas a process gas containing water is introduced.

The object which forms the basis of the invention is also solved by a method for thermally treating semiconductor wafers having at least one semiconductor layer to be oxidized, preferably a silicon layer, and a metal layer, e.g. a tungsten layer, not to be oxidized, whereby the semiconductor wafer is received in a treatment chamber with at least one wall part located adjacent to radiation sources, said wall part being substantially transparent for the radiation of the radiation source, and the wafer is heated, whereby material emitted or evaporated from the substrate comprises a metal, a metal oxide or a metal hydroxide, and the material is deposited or adsorbed on at least one cover plate between the wafer and the transparent wall part of the treatment chamber, so as to prevent it from becoming deposited on the transparent wall part of the treatment chamber.

With this method, there are the advantages already specified above in connection with the device.

Preferably, during the thermal treatment, a non-watery, hydrogen-containing process gas is introduced into the treatment chamber so as to make selective oxidation possible.

With a particularly preferred embodiment of the invention, the cover plate is removed from the treatment chamber and cleaned between subsequent treatment processes.

In general, the aforementioned method in accordance with the invention and the device in accordance with the invention are used with:

methods for thermally treating semiconductor substrates with at least one structure S in a process chamber by means of at least one thermal treatment cycle, whereby the structure S has at least two different materials A, B, and at least a first material A with a first component X of a process gas can form a first material a which is described by a first equilibrium reaction A+X<=>a+a', and the second material B with a second component Y of the process gas can form a second material b which is described by a second equilibrium reaction B+Y<=>b+b', whereby a' and b' are optional reactants, and whereby during the thermal treatment, for at least an interval of time, at least one concentration of a component X, Y of the process gas and at least one further process parameter is chosen in such a way, that the equilibrium of the first equilibrium reaction is displaced to the first material A and the equilibrium of the second equilibrium reaction is displaced to the second material b.

The semiconductor substrates are preferably semiconductor wafers made from silicon or materials containing silicon, which comprise e.g. structures in the form of multi-layered substantially planar elements located adjacent to one another, whereby the different materials A and B can be in different layers of the elements. These multi-layered planar elements are formed e.g. by gate stack structures, as described above, in which, e.g. the gate is formed from tungsten.

The process chamber is preferably the process chamber of a rapid thermal processing unit (RTP unit), but can also be a chamber of another unit for thermally treating semiconductor substrates.

A thermal treatment cycle should be understood as being the thermal processing of the semiconductor substrate, so that the semiconductor substrate is subjected to a periodically varying temperature sequence, the temperature/time curve of which has at least one temperature value which is higher than the start and end temperature of the treatment cycle. Thermal treatment of the semiconductor substrate can extend over several treatment cycles following on from one another.

With the gate structures specified at the outset, the first material A is, e.g. tungsten, and the second material B, e.g. silicon or poly-silicon, as described in greater detail in application DE 101 205 23 going back to the applicant. The first material a is a tungsten oxide compound which may occur, whereby, in particular, it can also be a hydroxide or a tungsten oxide. The second material b is a silicon oxide compound or a silicon oxide. With the selective oxidation process, a mixture of water-vapor and hydrogen is chosen as the first and second component X, Y of the process gas, so that the tungsten A is not, or is only to a small extent oxidized or any tungsten oxide or tungsten hydroxide reduced to tungsten, i.e. the equilibrium of the first equilibrium reaction is displaced to the first material A, i.e. to the tungsten. The second material B, in a special case polysilicon, on the other hand, reacts with the special process gas of hydrogen and water vapor to silicon oxide (the second material b) so that the equilibrium of the second equilibrium reaction is displaced to the second material b, the silicon oxide.

The first material A of the structure S can e.g., as described above, comprise a metal such as e.g. molybdenum, a metal oxide, metal nitride or a metal silicide or a metal hydroxide, which is e.g. oxidized or further oxidized by at least one component X of the process gas, or chemically altered in such a way that a volatile first substance a can form (as is e.g. the case with some metal hydroxide formations, e.g. with tungsten hydroxide), which contaminates the process chamber. This type of contamination is to be minimized by apparative and/or procedural measures so as to make such processes accessible to mass production.

The second material B of the structure S can comprise a semiconductor such as e.g. Si, a semiconductor oxide such as e.g. SiO and/or $SiO_2$, a semiconductor nitride such as $Si_3N_4$, a semiconductor oxy-nitride or a silicide, a glass such as e.g. a BPSG layer or material containing carbon, which, by means of the thermal treatment transforms into a desired chemical compound b (the second material), or which before the thermal treatment is already in this type of compound b (the second material), whereby, during the thermal treatment, the equilibrium of the second equilibrium reaction is displaced to the second material b.

In general, under the second material b, a change to the physical properties of the second material B, should also be understood, as, e.g. is the case when BPSG layers are subjected to thermal treatment, and said layers then distribute themselves by flowing evenly over the semiconductor substrate by means of a change in viscosity.

In FIG. 7 the concentration (or the pressure or partial pressure) of components X,Y and the ratio of the same to a process parameter, preferably the process temperature and the temperature of the semiconductor substrate, are schematically illustrated. For both equilibrium reactions there are four areas I to IV in which the equilibrium of the corresponding reaction is respectively displaced to one side, i.e. to the side of the corresponding products. The lines 1 and 2 show the parameter area for which the reaction rates $k_1, l_1$ for the forward reaction and the reaction rates $k_2, l_2$ for the return reaction lead to an equilibrium condition, so that the concentration of each reactant does not change any more over time, because of which these lines are described by the equilibrium constants (which are generally temperature dependent) of the reactions. It should also be mentioned that by the reaction, the type of the reaction velocity law is also defined, and which e.g. can be from 0-th to an n-th order.

The curve 3 in FIG. 7 schematically shows a concentration/temperature sequence which, e.g. is similar to that in the sequence described in German patent application DE 101 205 23, which goes back to the applicant, for the case of selective side wall oxidation of a tungsten gate stack structure. The advantage of this concentration/temperature sequence for a hydrogen/water vapor mix is that the depositing of tungsten oxides and tungsten hydroxides is reduced in such a way, that contamination of the process chamber only becomes noticeable after several thousand semiconductor substrates, and so the process is overall suitable for mass production. At point 10 of curve 3, for example, pure hydrogen with 0% water-vapor is introduced into the process chamber, and the semiconductor substrate is heated to a temperature of e.g. 800° C. After that, the concentration of water vapor in the hydrogen is increased to approx. 10%, while the temperature is held constant for a certain time e.g. 10 secs to 30 secs, by means of which point 12 of curve 3 is reached on the phase diagram. Finally, the temperature is increased again, e.g. to approx. 1050° C., whereby the water vapor/hydrogen concentration is kept constant. This is shown by point 11 in curve 3. After a certain dwell time of approx. 10 secs to 60 secs in point 11, the temperature is reduced, whereby preferably cooling takes place in pure hydrogen and at low temperatures (e.g. below 800° C.) in nitrogen. This is schematically reproduced by the curve sections 11–13 and 13–14. During the heat-up phase of the substrate, i.e. during the curve lineament 10–12–11 of curve 3, it is ensured by the selection of the process management with regard to process gas composition and temperature of the semiconductor substrate, that the process runs in metal reduction area II and in the silicon or semiconductor oxidation area III, so that selective oxidation of the semiconductor, but no oxidation of the metal takes places, but that this is reduced with the possible presence of a metal oxide layer or a metal hydroxide layer so that after the process, the metal is in the form of pure metal, also on its surface. During cooling, it is preferred if the oxidizing components (e.g. the water vapor) are removed from the process gas, and the cooling takes place, e.g. in pure hydrogen, whereby, contrary to the representation in FIG. 7, the reduction zone IV of the semiconductor will generally not be passed through, or will only be passed through for a short time, so that any reduction of the semiconductor oxide (second material b) does not have a damaging or disadvantageous effect upon the structure S.

It is another aim of this invention to provide an improved or alternative process management to the process management represented by FIG. 7, and one which could also be used in mass production.

This problem is solved by the fact that at least one concentration and/or a partial pressure or pressure of at least one component X, Y of the process gas is constantly changed as a function of the further process parameter, e.g. the process temperature or the process time.

This is preferably achieved by at least one gas flow meter being regulated dependent upon the further process parameter or the gas flow meter being controlled.

By controlling or regulating the gas flow meter, almost any process curve, as represented e.g. in the phase diagram shown in FIG. 8, can be achieved. The process curve here can be a closed or an "open" curve, i.e. a process whereby the start and end point of the process are the same in the parameter range shown, or with an "open" curve, the start and end point are different.

Alternatively or additionally to regulation or control of at least one gas flow meter, the total pressure or a partial pressure can be set within the process chamber by means of a pump device.

By regulating or controlling at least one gas flow meter and/or the pressure within the process chamber, active control of the process sequence is possible.

Alternatively, or additionally, "passive" control of the process sequence can also take place, whereby a second process gas with clearly defined composition is introduced into a volume (e.g. chamber volume) filled with a first process gas. By mixing or exchanging the first and second process gas, in a certain way constant change of at least one component of the process gas is achieved. Of course, very tight limits regarding applicability are set for this passive method.

The applicability limits for the passive method for control of the process sequence can be extended by an additional chamber, which if required can be variable with regard to volume, whereby this additional chamber can also serve as a mixing chamber so as to mix the components of the process gas before entering into the process chamber and not for the first time in the process chamber itself.

In FIG. 8 a closed process curve is shown schematically by means of the curve 10–11–12–13–10, said curve showing one of the possible alternative processes for the process for selective tungsten gate stack oxidation shown in FIG. 7 in curve 3. By active control or regulation of the water vapor/hydrogen ratio as a function of the process temperature (semiconductor temperature), it is possible to let the water concentration rise from e.g. originally 0% in point 10 to e.g.

5% to 50% in point 11. Here, with the selective tungsten gate stack oxidation it makes sense to keep the water vapor proportion low at first so that the same does not substantially exceed 5%, and preferably does not exceed 1% in the temperature range from room temperature to approx. 700° C. By slowly increasing the water concentration in the process gas, it is ensured that any metal oxide e.g. tungsten oxide or metal hydroxide, e.g. tungsten hydroxide, which may be present, can be reduced by means of the hydrogen present as the majority component, because the process runs totally in the metal reduction area II. After the reduction of any compounds a such as e.g. the metal oxide or metal hydroxide mentioned, the temperature is increased further from point 11 to point 12, whereby the concentration of the water vapor is chosen so that the process also runs in the metal reduction zone II, however so that maximum oxidation of the semiconductor takes place with the highest possible process temperature, i.e. so that the process curve in the phase diagram near to maximum temperature runs as close as possible to the equilibrium curve 1 between e.g. metal oxidation zone I and metal reduction zone II. This guarantees, e.g. the best possible oxide quality of the semiconductor oxide layer formed. For cooling of the semiconductor substrate, the curve shown in FIG. 7 can be chosen, whereby the water vapor content is set to 0% as quickly as possible, e.g. by means of the aforementioned passive control of the gas composition. Alternatively, or additionally, by means of active control of the gas composition, the water vapor concentration can be reduced and so the hydrogen concentration increased as a function of the falling temperature on the curve section 12–13, so that the oxide growth or the formation of the second material b is reduced. This has often proved to be advantageous because the quality of the second material b, e.g. a semiconductor oxide such as $SiO_2$ is also reduced with the falling temperature, and so reduced formation of this is desirable. This is achieved by constantly reducing the concentration e.g. of the water vapor. From point 13 the concentration of the process gas components can be controlled or regulated in such a way that the semiconductor reduction area or area IV is not reached.

In the curve 10–11–12–13–10 shown in FIG. 8, the direction and the curve can run, also as chosen. Above, clockwise running of the process curve was described, i.e. so that the concentration of at least the dominant reactive process gas components is greater with increasing temperature than is this concentration with decreasing temperature. Dependent upon the application, a process curve can, however, run anti-clockwise, i.e. so that the concentration of the dominant reactive process gas component is smaller with increasing temperature than with decreasing temperature. This can be advantageous, e.g. with BPSG Reflow processes, whereby the reactive process gas component here is hydrogen and/or water vapor.

As described above, the process curve can be closed or open, by it can also, as well as strictly monotonously increasing and strictly monotonously decreasing areas, only comprise monotonous or strictly monotonous areas, or consist of such an area, such as e.g. a line.

The process curves, as they were schematically represented in FIGS. 7 and 8, represent with a single pass through, a thermal treatment cycle. During thermal treatment of the semiconductor substrate, the process curves can also pass through the cycle more than once to several times.

Preferably, the time interval in which at least one concentration of the components X, Y of the process gas and at least the further process parameter is chosen so that the equilibrium of the first equilibrium reaction is displaced to the first material A and the equilibrium of the second equilibrium reaction displaced to the second material b, chosen within a thermal treatment cycle.

The interval of time can, however, also extend over several thermal treatment cycles. In this case, the first equilibrium reaction can substantially take place within a thermal treatment cycle, and the second equilibrium reaction substantially within another thermal treatment cycle.

Preferably, the further process parameter is the process temperature and/or a temperature of a material A, B and/or of a material a, b of the structure S. In the case of the aforementioned tungsten gate stack to structure, the temperature of the semiconductor substrate is preferably chosen.

The further process parameter can also comprise a further gas concentration of a component of the process gas, the pressure of a process gas, a partial pressure of a component of a process gas, a magnetic field of predetermined strength and/or a portion of UV light which acts upon the semiconductor substrate, or a combination of the aforementioned parameters.

The structures S preferably have horizontal layers with at least one material A, B, but they can also have vertical layers with at least one material A, B or a combination of horizontal and vertical layers of the materials A, B.

In addition, the materials A, B can be separated by at least one material C different to A and B.

With a chemical change to the second material B, the second material b can form on the second material B, preferably on the surface of the second material B, as e.g. is the case with oxidation or nitridation of silicon.

The semiconductor substrate is preferably a silicon wafer, a crystalline or amorphously grown or deposited semiconductor layer, a substrate or a layer of a IV—IV semiconductor, a II–VI semiconductor or a III–V semiconductor.

As already mentioned in relation to the tungsten gate stack structure, the first material A preferably comprises a metal and the second material a semiconductor B. In this case, the metal of the first material A can at least partially be covered by a metal oxide or a metal nitride layer, a metal oxynitride layer or a metal hydroxide layer which comprises or forms the first material a and can be formed e.g. by means of the first equilibrium reaction. The semiconductor of the second material B can be at least partially covered by an oxide, nitride or oxynitride layer which comprises or forms the second material b and can be formed e.g. by means of the second equilibrium reaction.

Preferably, the first component X and the second component Y are the same, or at least comprise one same material, such as e.g. a water vapor/hydrogen mixture.

In the same way, the optional reactants a', b' can be the same, or at least comprise one same material.

For example, the first component X and the second component Y can comprise water, and the reactants a', b' hydrogen, or the first and/or second component X, Y can comprise a mixture of water and hydrogen. In the same way, the first and/or second component X, Y can comprise a mixture of water and oxygen.

The method in accordance with the invention can also be carried out in such a way that the first and/or second component X, Y comprises a first mixture of water and hydrogen or a second mixture of water and oxygen, and that during the thermal treatment, the first and/or second component X, Y from the first mixture is returned or transferred into the second mixture.

With the method in accordance with the invention a process gas can also be used which comprises at least during part of the thermal treatment ammonia $NH_3$. This can e.g. be advantageous with the selective side wall oxidation of a tungsten gate stack structure if the tungsten comprises a tungsten nitride layer $WN_x$, which restricts oxidation of the tungsten and so also volatilization of the tungsten oxide and any tungsten hydroxide. Any contamination of the chamber can be reduced in this way. The tungsten nitride can be formed in pure ammonia by adding ammonia to the process gas or by a first process step (i.e. a first temperature/time curve by means of which the semiconductor substrate is acted upon), or the structure can already have a metal nitride layer on the metal surface. The ammonia contained in the process gas maintains the protective metal nitride layer at least for a certain time or a certain temperature, and so prevents possible metal oxidation. For tungsten, in the temperature range of between 800° C. and 1000° C. in pure ammonia, a strong formation of tungsten nitride is seen which has a pronounced maximum at approx. 930° C. to 950° C., as shown by FIG. 10, in which the resistance of the layer is correlated with that of the layer thickness of the tungsten nitride layer, shown as a function of the temperature. This maximum can e.g. also be used for the temperature calibration of RTP units, in particular in order to co-ordinate different units to a common temperature scale. The layer resistance of the tungsten nitride layer, for example, can be determined here as a function of the process temperature. At approx. 940° C. the layer resistance then has a very pronounced maximum which can serve as the calibration point for the temperature scale.

The formation of metal nitride is of course strongly dependent upon the further composition of the process gas, in particular upon any presence of oxidizing components such as oxygen or water vapor. With the presence of approx. 15% water vapor in hydrogen in ammonia-free process gas, for example from approx. 700° C. any tungsten nitride layer with process times of 60 secs is clearly broken down so that oxidation of the metal can then take place, and so the risk of contaminating the chamber increases. By adding ammonia to the process gas, the decomposition temperature of the metal nitride can be increased. In this way, it is now possible to carry out processes corresponding to the curves 10–14–15–12–13–10 or 10–11–16–15–12–13–10 or similar shown in FIG. 9, which are distinguished by the fact that due to a protection layer on the material A, such as e.g. a metal nitride layer, e.g. a tungsten nitride layer, which is formed and/or maintained by means of a protection layer-forming reactive process gas component, at least one part of the process can proceed within Zone I in which the first material a forms—i.e. by means of the maintenance or formation of a protection layer, the equilibrium line 1 of the first equilibrium reaction can be exceeded in a short time, as shown for both of the aforementioned process managements, for example, between points 14 and 15, and 16 and 15. The advantage of this is that, e.g. the oxidation of the semiconductor can take place at lower temperatures with higher ratios, i.e. e.g. by means of higher water concentrations, by means of which the thermal loading of the structures is reduced.

The principle of using a protection layer or the in situ formation or the maintenance of a protection layer which covers a material A or B of the structure, and by means of a reactive protection layer-forming process gas component in large areas of thermal treatment offers protection against the formation of the first material a in area I and/or the reduction of the second material b in area IV of the phase diagram, does not only make it possible to extend the process management in area I which e.g. is a metal oxidation area, but expansion into area IV of the phase diagram is also possible, which is e.g. the reduction area of the semiconductor, or better of the semiconductor oxide.

Preferably, at least one of the materials A, B or of the materials a, b comprises tungsten, molybdenum, platinum, iridium, copper and/or oxides, nitrides and/or hydroxides of the same, such as tungsten oxide, tungsten nitride or tungsten hydroxide.

In addition, the thermal treatment of the method in accordance with the invention is preferably carried out in a process chamber of a rapid thermal processing (RTP) or fast heating unit.

It can be advantageous, as already mentioned, for the process chamber to comprise at least one covering device between the semiconductor substrate and at least one process chamber wall for the at least partial covering of the process chamber wall.

The introduction of covering devices also has the advantage, similar to that of the protection layer-forming reactive process gas components, that, as is shown schematically in FIG. 9, the thermal treatment of the semiconductor substrate can take place at least partially in the metal oxidation area I and/or in the semiconductor reduction area IV, without the process chamber itself becoming contaminated in an inadmissible way. Any metal oxides or metal hydroxides are blocked by the covering device. These can then be changed and cleaned, as already mentioned.

In this way, both by means of the cover plates as well as by means of the protection layer-forming reactive process gas components, a possibility is created of carrying out the thermal processing of structured semiconductor substrates in such a way that the process sequence with regard to concentration of the process gas and a further process parameter (preferably of the substrate temperature) intersects a phase limit line (1 or 2 in FIGS. 7 to 9) at least once by means of an equilibrium reaction, whereby in at least one phase, a first material a forms, whereby this can be volatile and can lead to possible contamination of the process chamber in the absence of a covering device such as e.g. the described cover plate and/or the protection layer and/or the protection layer-forming reactive process gas component. By active regulation or control of at least one component of the process gas, this invention opens up a maximum number of process possibilities. In particular, the applicants are expecting applications in the future in the areas of transistor production, such as e.g. in the above illustrated tungsten gate stack process, in the area of high K and low K applications, in the area of the glass reflow processes with selective reactions, or in the area of the production of capacitors.

BRIEF DESCRIPTION OF THE DRAWINGS

In the following, the device is described in greater detail with reference to the drawings. In the drawings.

DESCRIPTION OF SPECIFIC EMBODIMENTS

Figure 1:
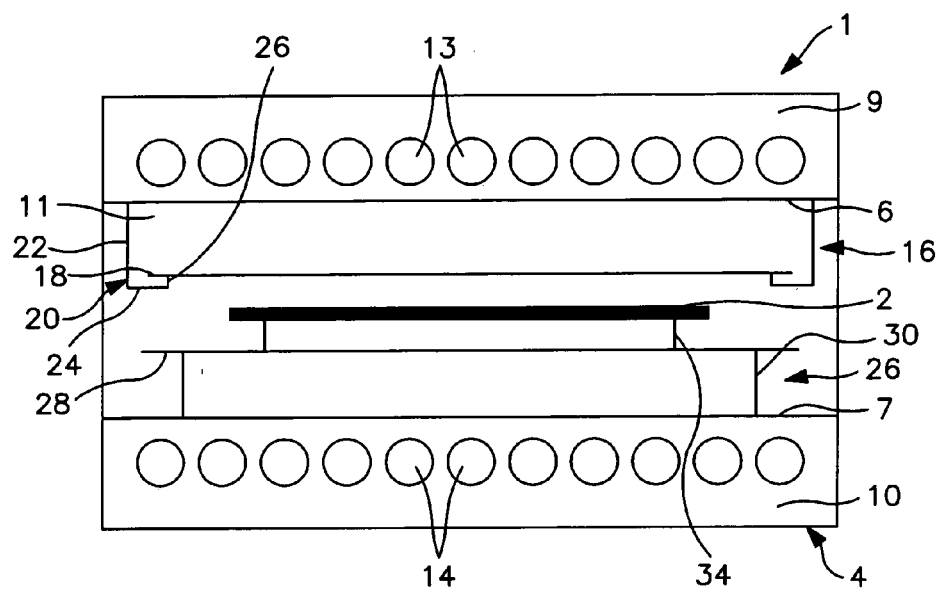
FIG. 1 shows a schematic sectional view through a rapid thermal processing unit for semiconductor wafers in accordance with a first embodiment of this invention.

FIG. 1 shows a schematic sectional view through a rapid thermal processing unit 1 for thermally treating semiconductor wafers 2 having at least one silicon layer to be oxidized and a metal layer, preferably a tungsten layer, which is not to be oxidized.

The rapid thermal processing unit 1 has a schematically represented housing 4 which is divided by upper and lower quartz walls 6, 7 into an upper lamp chamber 9, a lower lamp chamber 10 and a process chamber 11. The housing 4 has a closable opening (not illustrated) in the area of the process chamber 11, so as to make it possible to load and unload the semiconductor 2.

In the upper lamp chamber 9, there are a number of heating lamps 13, arranged parallel to one another, and which can be controlled so as to heat the wafer 2 in a known manner.

In a corresponding manner, in the lower lamp chamber 10 there are a number of heating lamps 14, arranged parallel to one another, which once again can be controlled so as to heat the semiconductor wafer 2 in a known manner.

In the area of the lamp chambers 9 and 10, the housing 4 has inwardly facing reflective surfaces so as to reflect the radiation from the lamps 13, 14 to the process chamber 11.

Within the process chamber 11, a first holding device 16 is provided for a cover plate 18. The cover plate 18 is made from a material which is non-transparent for the radiation from the lamps 13 and 14, and has an outline shape which corresponds to the wafer 2. However, this cover plate 18 is of such dimensions that it has a greater diameter than the wafer 2 and covers a "visual join" between the wafer 2 and the quartz wall 6.

The holding device 16 for the cover plate 18 consists of several support elements 20 which extend from the quartz plate 6. The support elements 20 have respectively a first leg 22 which extends at right angles from the upper quartz plate 6. On the lower open end of the leg 22 there is a second leg 24 which is at right angles to this and extends to the center of the chamber, at the open end of which there is yet another third leg 26 which extends upwardly. The open end of the leg 26 forms a support for the cover plate 18 which lies loosely on top of this. Preferably, three of the holding elements 20 are provided for the cover plate 18 so as to provide a secure three-point support. Moreover, the holding elements 20 are arranged in such a way that it is possible to simply lift the cover plate 18 and pull it out to the side from the non-illustrated opening in the housing 4.

Within the process area 11 there is, in addition, a second holding device 26 for a second cover plate 28. The holding device 26 consists of three support pins 30 which extend at right angles to the lower quartz plate 7, on which the cover plate lies 28 loosely. So as to hold the plate 28 securely, these can have small indentations into which the holding elements 30 extend, such as, for example, a conical indentation into which a conical point of the holding element 30 can extend. This type of complementary indentation can also be provided for the upper cover plate 18.

On an upper side of the lower cover plate 28 there are a number of support pins 34, preferably three, which extend substantially at right angles to the cover plate 28 and form a support for the wafer 2. The upper cover plate 18 and the lower cover plate 28 are respectively made from a material which is non-transparent for the radiation from the lamps 13 and 14, so that the wafer 2 which is positioned between these is not directly heated by the radiation from the lamps 13, 14, rather indirectly via a radiative and convective energy coupling between the wafer 2 and the cover plates 18, 28, which are heated by the respective lamps 13 and 14. Alternatively, it is however also possible to design the cover plates 18, 28 so that they are transparent for the radiation from the lamps 13 and 14, so as to make it possible to heat the wafer 2 directly by the lamps 13 and 14.

In the following, the treatment of a semiconductor wafer 2 in the rapid thermal processing unit 1 in accordance with the invention is described in greater detail with reference to FIG. 1.

First of all, a semiconductor wafer 2 with a silicon layer to be oxidized and a metal layer, preferably a tungsten layer, which is not to be oxidized is loaded into the rapid thermal processing unit 1 and laid onto the support pins 34. Next, the housing 4 is closed, and first of all nitrogen is conveyed through the process area 11 at a low first temperature so as to remove any oxygen which may be present. Pure hydrogen gas is then introduced into the process area, whereby the temperature of the wafer 2 is first of all held constant, and then increased to a higher temperature of, for example, 800° C.

After reaching the increased temperature of, for example, 800° C., a hydrogen/water mixture is introduced into the process area, whereby, for example, an atmosphere with a water content of under 20 volume percent, and in particular 14 volume percent is set. The temperature of the wafer is first of all held constant, and then increased to an even higher temperature of for example 1050° C. With this increased temperature there is a reaction between the hydrogen/water mixture and the wafer. In particular, there is oxidation of the accessible surfaces of the silicon layer of the semiconductor wafer. Oxidation of the metal or tungsten layer can be controlled by setting a specific mix ratio of the hydrogen/water mix. In order to prevent oxidation of the metal, the mix ratio must be set so that an oxidation reaction of the mixture (caused by oxygen in the water) and an associated reduction reaction (caused by the hydrogen) remain in equilibrium or the reduction reaction in slight inequilibrium. Meanwhile, there is always the formation of a tungsten oxide which is volatile at the process temperatures, and so can distribute itself in the process area, where it is then reduced by the hydrogen to metallic tungsten. In order to prevent the volatile tungsten oxide from becoming deposited on the process chamber walls, and in particular on the quartz walls 6, 7, the upper and lower cover plates 18, 28 are provided, and these limit the freedom of movement of the volatile tungsten oxide and offer surfaces for the adsorption of the tungsten oxide or the metallic tungsten. Tungsten oxide evaporating from the wafer 2 can adhere to the cover plates 18, 28 and it is prevented from moving towards the quartz plates 6, 7 and from contaminating these in such a way that the heat output from the lamps 13, 14 is affected. If the tungsten oxide deposits itself on the cover plates 18, 28, it is oxidized to tungsten by the hydrogen, as mentioned, and it remains on the cover plates 18, 28. Because these are non-transparent for the radiation from the lamps 13, 14, the deposits do not affect the heat output of the rapid thermal processing unit 1.

After the treatment with the hydrogen/water mixture, there follows a new treatment with pure hydrogen gas so as to bring about total return of any tungsten oxide into metallic tungsten, and the temperature within the process area 1 is lowered. Next, nitrogen is made to flow through the process area once again.

By introducing a non-watery substance containing hydrogen before and after treating the wafer with a hydrogen/water mixture, the formation of tungsten oxide and the release of the same from the wafer is reduced. By means of the cover plates 18, 28, metallic tungsten or tungsten oxide can moreover be prevented from being deposited on the quartz plates 6, 7.

Next, the wafer is taken out of the rapid thermal processing unit 1, and a new wafer can be installed for a corresponding treatment. After a specific number of wafer treatments, the cover plates 18, 28 which respectively lie loosely on their holding elements, can also be removed from the process area so that they can be cleaned, and so as to remove any tungsten which has been deposited on them. The cover plates 18, 28 can be removed with the same handling device as the wafer 2, whereby in this case, the handling device preferably engages the surfaces facing away from the wafer 2, so as to avoid contamination of the handling device. Alternatively, the handling device can also be cleaned between handling of the covering plates 18, 28 and handling of a wafer 2.

Although the cover plates 18, 28 were described as impermeable to the radiation from the lamps, it is also possible to use transparent plates, whereby these must then be removed more frequently from the process chamber and cleaned, if so required after each time that the wafer is handled, so as to prevent the influence of metal which has been deposited onto the cover plates 18, 28. For example, the lower cover plate and the wafer can be removed as one unit from the process chamber. If the upper cover plate were supported by the lower cover plate, both cover plates could be removed as one unit with the wafer positioned between them. Also, a handling device could be provided with three support or gripping elements which would mean that the cover plates and the wafer could be grasped at the same time.

Figure 2:
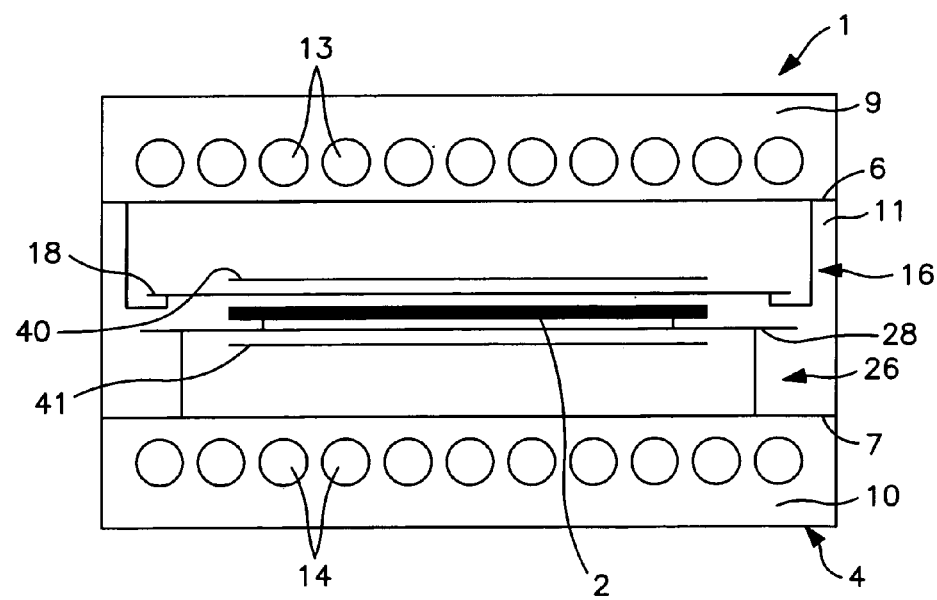
FIG. 2 shows a schematic sectional view through a rapid thermal processing unit for semiconductor wafers in accordance with a second embodiment of this invention.

FIG. 2 shows an alternative embodiment of a rapid thermal processing unit 1 of this invention. In so far as the same or similar components are present, the same reference numbers as in FIG. 1 will be used.

The rapid thermal processing unit 1 in accordance with FIG. 2 once again has a housing 4 which is internally divided by quartz walls 6, 7 into upper and lower lamp chambers 9, 10, and a process chamber 11 located between the same. On the inside of the process chamber 11 there is once again a first holding device 16 provided to hold a cover plate 18, whereby the holding device 16 is of the same structure as with the embodiment in accordance with FIG. 1. In addition, a second holding device 26 is provided to hold a second, lower cover plate 28. The holding device 26 is once again the same as the holding device in accordance with FIG. 1. When the process chamber 11 is loaded, a semiconductor wafer 2 is positioned between the cover plates 18, 28, as shown in FIG. 2. The cover plates 18, 28 once again extend parallel to the wafer 2, and in comparison to the embodiment in accordance with FIG. 1, they are located at a smaller distance away in relation to the wafer 2. In this way, better screening from evaporating metal or metal oxide can be achieved for the quartz walls 6, 7. In the embodiment shown in FIG. 2, the cover plates 18, 28 are made from a non-transparent material. Above and below the cover plates 18, 28 non-transparent, light-transforming plates 40, 41 are, however provided for the radiation from the lamps 13, 14, and these are held by holding devices (not illustrated in detail) within the process chamber. The light-transforming plates 40, 41 are held parallel to the cover plates 18, 28 and the wafer 2 which is positioned between the same. The light-transforming plates 40, 41 have substantially the same outer dimensions as the wafer 2, so as to substantially prevent radiation from the lamps 13, 14 from falling directly onto the wafer 2. Instead of being heated directly by the lamp radiation, there is once again indirect heating of the wafer 2 by means of the light-transforming plates 40, 41. Contrary to the cover plates 18, 28, the light-transforming plates 40, 41 are substantially fixed in the process chamber 11.

The treatment of a semiconductor wafer in the rapid thermal processing unit 1 in accordance with FIG. 2 happens substantially in the same way as treatment in the rapid thermal processing unit 1 in accordance with the first embodiment shown in FIG. 1.

FIG. 3 shows another alternative embodiment of a rapid thermal processing unit 1, whereby in FIG. 3 once again the same reference numbers are used as in FIG. 1, in so far as the same or similar elements are described.

Figure 3:
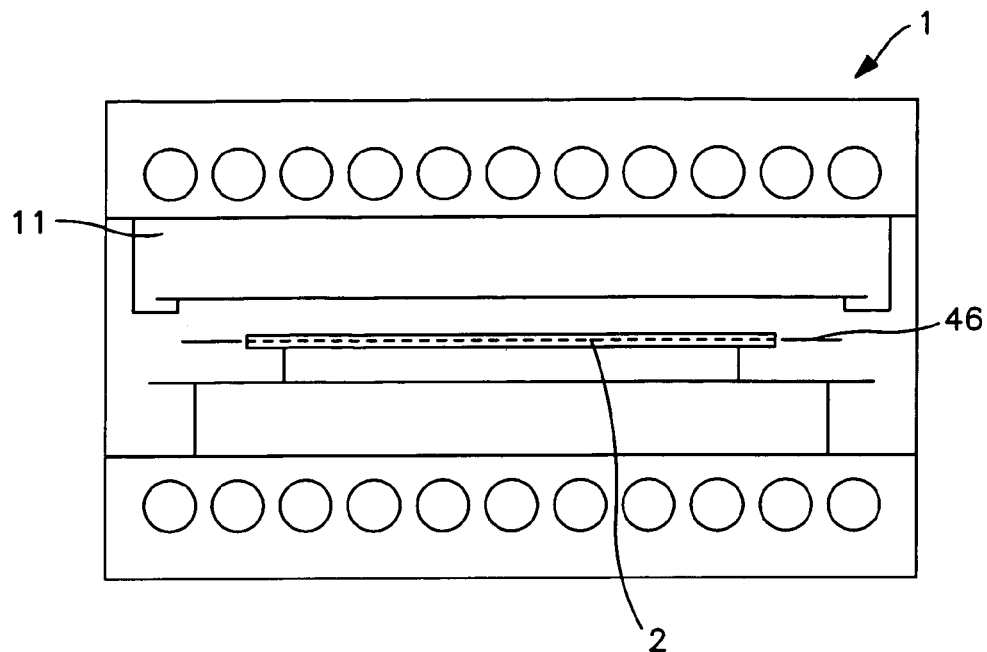
FIG. 3 shows a schematic sectional view through a third embodiment of a rapid thermal processing unit in accordance with this invention.

The rapid thermal processing unit 1 in accordance with FIG. 3 is of the same structure as the rapid thermal processing unit 1 in accordance with FIG. 1, whereby, however, in addition a compensation ring 46 is provided around the substrate 2 in order to compensate edge effects when heating or cooling the semiconductor wafer 2. The compensation ring 46 can be in one section or consist of several segments, and can also be removed from the process chamber 11 of the rapid thermal processing unit 1 for cleaning. The compensation ring 46 is held by a holding device (not illustrated in detail) in the plane of the wafer 2, whereby the compensation ring 46 can be at least partially moved out from the plane of the wafer 2 so as to make loading and unloading of the wafer 2 easier. This can be achieved, for example, by swivelling the compensation ring 46, or certain segments of the same.

The wafer treatment in the rapid thermal processing unit 1 in accordance with FIG. 3 happens in the same way as with the first embodiment shown in FIG. 1.

Figure 4:
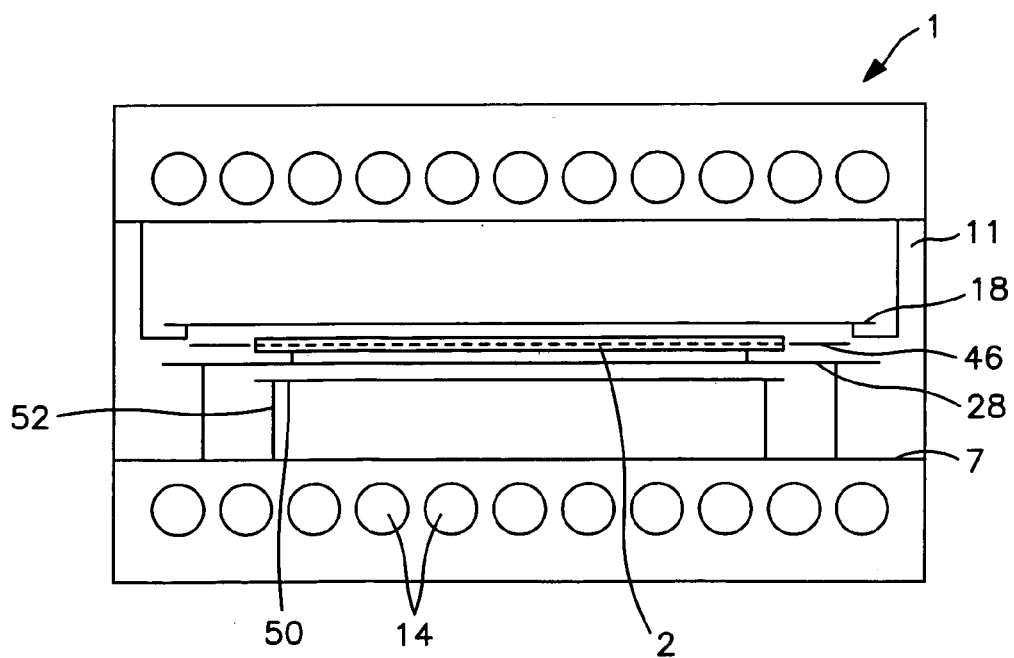
FIG. 4 shows a schematic sectional view through a fourth embodiment of a rapid thermal processing unit for semiconductor wafers in accordance with this invention.

FIG. 4 shows another embodiment of a rapid thermal processing unit 1 for semiconductor wafers 2. In FIG. 4 the same reference numbers are used once again as with the previous embodiments, in so far as the same or equivalent components are used.

The embodiment in accordance with FIG. 4 substantially corresponds to the embodiment in accordance with FIG. 3. Within a process chamber 11, upper and lower cover plates 18, 28 are provided which are held by corresponding holding devices parallel to a wafer 2 received in the process chamber 11.

With the embodiment in accordance with FIG. 4, the upper cover plate 18 is made from a material which is non-transparent for the lamp radiation, whereas the lower cover plate 28 is made from a material which is substantially transparent for the lamp radiation, such as for example quartz. In order to prevent direct heating of the wafer 2 by the lamps 14 located at the bottom, a light-absorbing plate 50 is provided between the lower quartz wall 7 and the cover plate 28 which is substantially of the same structure as the light-absorbing plate 41. The light-absorbing plate 50 is held in the process chamber 11 by corresponding holding pins 52.

The treatment of the semiconductor wafer 2 in the rapid thermal processing unit 1 in accordance with FIG. 4 happens in the same way as the treatment in the rapid thermal processing unit 1.

Figure 5:
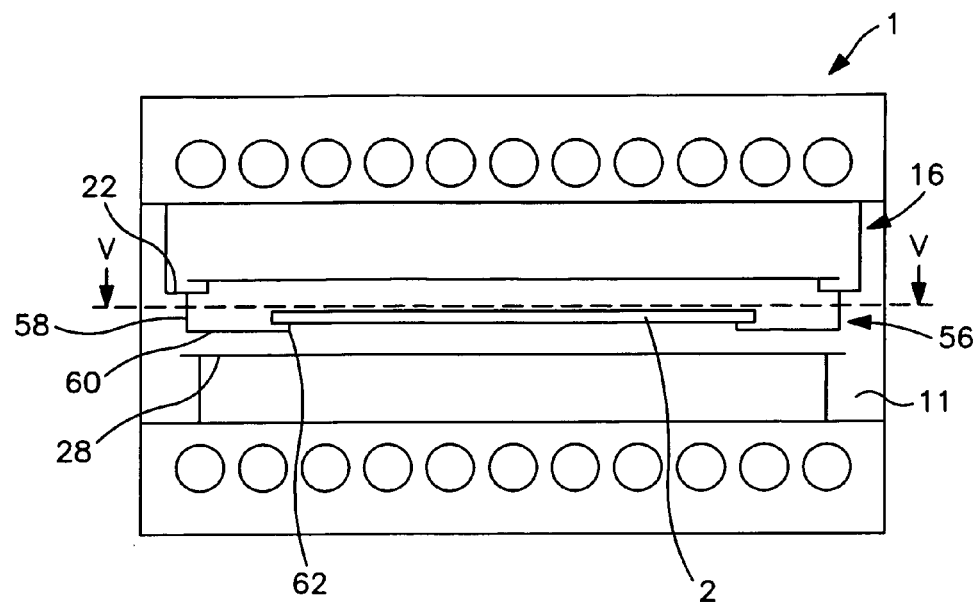
FIG. 5 shows a schematic sectional view through a fifth embodiment of a rapid thermal processing unit for semiconductor wafers in accordance with this invention.

FIG. 5 shows another alternative embodiment of the invention, whereby the rapid thermal processing unit 1 shown in FIG. 5 is of substantially the same structure as the rapid thermal processing unit 1 in accordance with FIG. 1. The only difference is that the semiconductorwafer 2 is not laid on top of holding pins 34 which extend from the lower cover plate 28. Instead, a separate holding device 56 is provided for the semiconductor wafer 2 which is coupled with the leg 22 of the holding device 16. The holding device 56 has a first leg 58 which extends at right angles to the leg 22 of the first holding device 16, a leg 60 which extends at right angles to this and to the center of the chamber, and a leg 62 which extends upwards, the open end of which forms a support surface for the wafer 2. The advantage of this holding device 56 for the wafer 2 is that the lower cover plate has a level surface without holding elements on top of it, and is therefore easier to handle and to clean.

Figure 6:
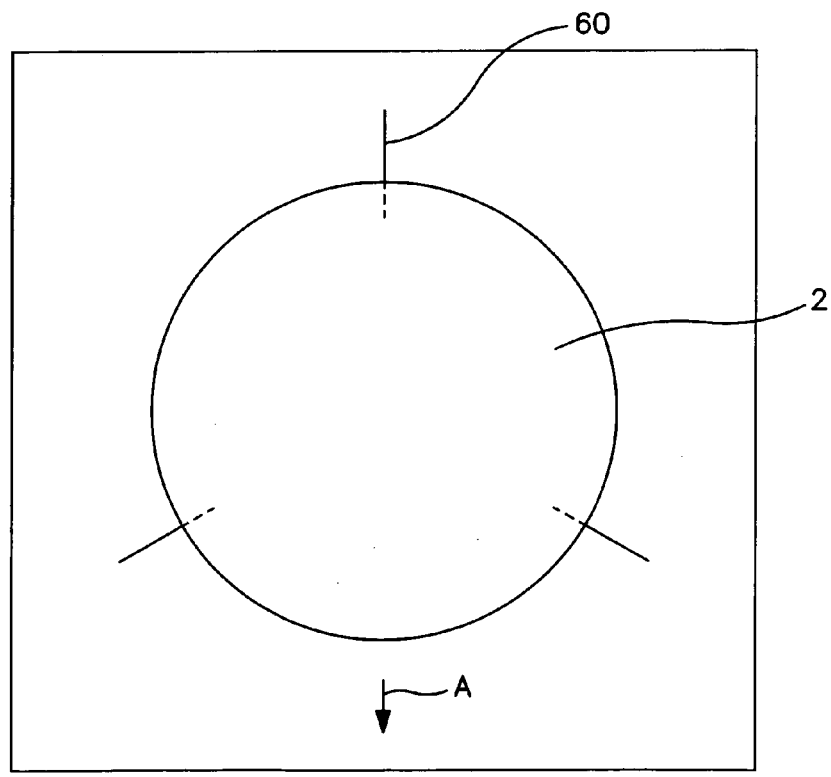
FIG. 6 shows a sectional view from above in accordance with line V—V in FIG. 5.
Figure 7:
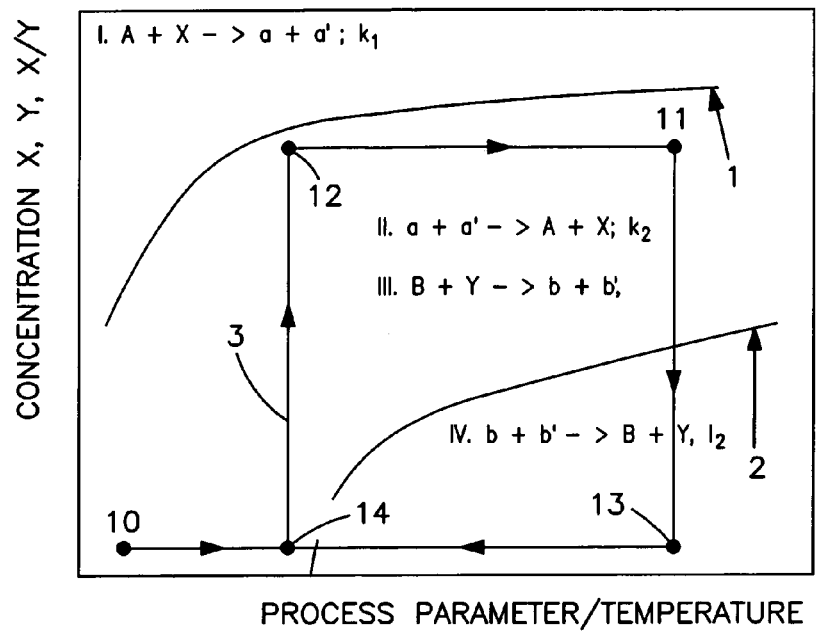
FIG. 7 shows a phase diagram with a schematic process management.
Figure 8:
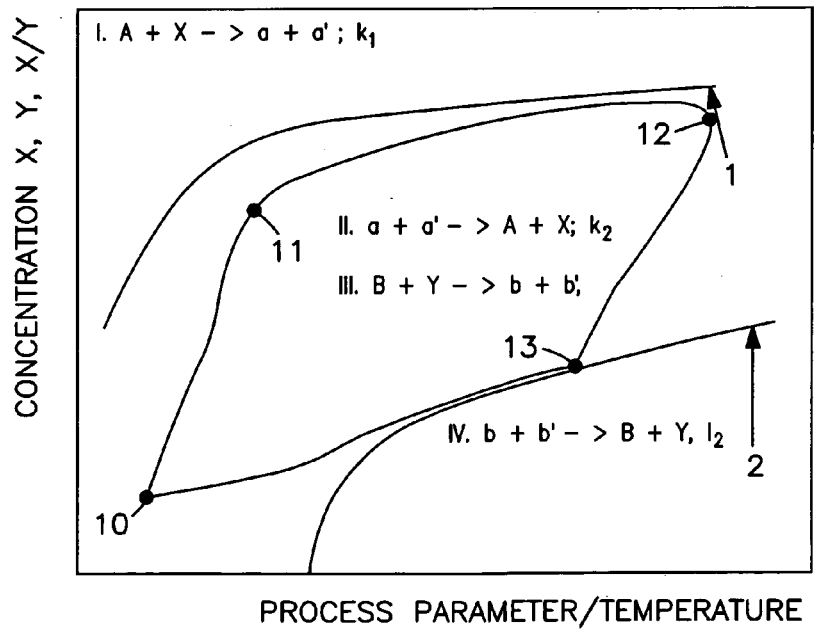
FIG. 8 shows a phase diagram with a schematic process management by means of active control or regulation of at least one reactive component of the process gas.
Figure 9:
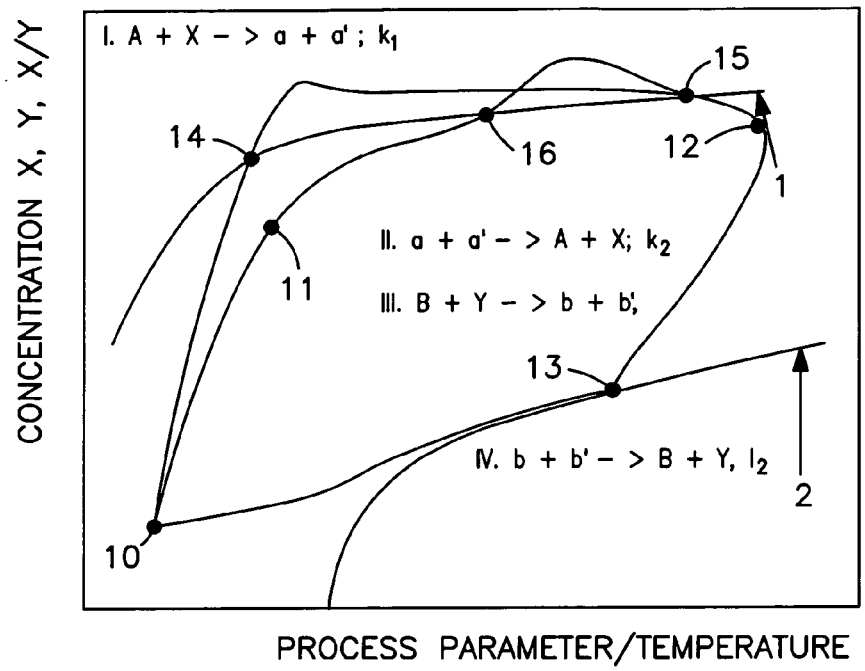
FIG. 9 shows a phase diagram with a schematic process management by means of active control or regulation of at least one reactive component of the process gas which intersects the phase limits.

FIG. 6 shows a sectional view through the rapid thermal processing unit 1 along the line V—V in FIG. 5. As can be seen in FIG. 6, the holding device 56 has three holding elements, of which in FIG. 6 the respective leg 60 can be identified. The holding elements are arranged in such a way, however, that the wafer 2 can be removed from the side of the process chamber 11 after lifting off from the legs 62, as shown by the arrow A. The special holding device 56 for the wafer 2 thus makes it possible to freely grasp the wafer 2, and makes it possible to load and unload the same easily. This type of arrangement of the individual holding elements is also provided for the holding elements of the holding device 16 in order to make it possible to remove the upper cover plate 18 from the side.

The treatment of the wafer 2 in the rapid thermal processing unit 1 in accordance with FIG. 6 happens in the same way as with the first embodiment shown in FIG. 1.

Although the invention was described using preferred embodiments of the invention, it is not limited to the embodiments actually described. For example, the holding devices 16, 26 and 56 for the cover plates 18, 28 and the wafer 2 can extend not only from the respective upper and lower quartz plates 6,7, but also from side walls of the process chamber 11. Moreover, the quartz walls 6,7 need not extend over the full width of the process chamber 11. Rather, they can also form just one section of the upper and lower walls of the process chamber 11. In order to make cleaning of the respective cover plates easier, the surfaces facing the substrate could respectively be coated, whereby the coating preferably consists of a material which is easy to clean. Other preferable embodiments of the invention are described in the patent claims. The features of the different embodiments and examples can be changed and/or combined with one another in any way, so long as they are compatible.

The specification incorporates by reference the disclosure of German priority document 102 36 896.1 filed 12 Aug. 2002 and PCT/EP2003/008220 filed 25 Jul. 2003.

The present invention is, of course, in no way restricted to the specific disclosure of the specification and drawings, but also encompasses any modifications within the scope of the appended claims.

The invention claimed is:

1. A device for thermally treating semiconductor wafers or substrates having at least one silicon layer that is to be oxidized and a metal layer, preferably a tungsten layer, that is not to be oxidized, said device comprising:
    at least one radiation source;
    a treatment chamber for receiving a substrate, wherein said chamber has at least one wall part located adjacent to the at least one radiation source, and wherein said wall part is substantially transparent for radiation from said at least one radiation source;
    at least one cover plate disposed between the substrate and said at least one wall part of said treatment chamber located adjacent to said at least one radiation source, wherein said at least one cover plate is dimensioned such that it fully covers said transparent wall part of said treatment chamber in relation to the substrate, in order to prevent material, comprising a metal, metal oxide or metal hydroxide, such as tungsten, tungsten oxide or tungsten hydroxide, emitted or evaporated from said substrate from reaching said transparent wall of said treatment chamber; and
    a handling device for automatically removing and inserting said at least one cover plate from or into said treatment chamber, wherein said handling device contacts said cover plate only on the surface facing away from the substrate.

2. A device according to claim 1, wherein said at least one cover plate is substantially non-transparent for the radiation of said at least one of radiation source, and/or said at least one cover plate lies loosely on holding elements in said treatment chamber.

3. A device according to claim 1, wherein said handling device for said at least one cover plate is also provided for a loading and unloading of substrates.

4. A device according to claim 1, wherein at least one respective cover plate is disposed above and below the substrate, and/or wherein different cover plates are provided above and below the substrate.

5. A device according to claim 1, wherein a surface of said at least one cover plate facing the substrate is coated, for example by a material that is easy to clean.

6. A device according to claim 1, wherein a light-absorbing plate is disposed between said at least one cover plate and said at least one transparent wall part of said treatment chamber.

7. A device according to claim 1, wherein said at least one cover plate is composed of glass, in particular quartz glass.

8. A device according to claim 1, wherein at least one device is provided for introducing a non-watery, hydrogen containing process gas into said treatment chamber.

9. A device according to claim 8, wherein a control unit is provided for introducing said non-watery, hydrogen containing process gas prior to and/or after introduction of a hydrogen/water mixture.

10. A method for thermally treating semiconductor wafers having at least one semiconductor layer that is to be oxidized, preferably a silicon layer, and a metal layer, for example a tungsten layer, that is not to be oxidized, wherein a semiconductor wafer is disposed in a treatment chamber having at least one radiation source and a wall part located adjacent to the radiation source, said wall part being substantially transparent for radiation of the radiation source, said method including the steps of introducing at least one process gas into said treatment chamber;

heating the wafer, wherein material emitted from or evaporating from the wafer comprises a metal, metal hydroxide or metal oxide, and the material is deposited or adsorbed on at least one cover plate disposed between the wafer and the transparent wall part of the treatment chamber, so as to prevent the material from reaching the transparent wall part of said treatment chamber; and removing the at least one cover plate from the treatment chamber, using an automatic handling device, after the thermal treatment of a semiconductor wafer and inserting a cover plate into said treatment chamber prior to a subsequent thermal treatment of a semiconductor wafer, wherein the handling device contacts the cover plate only on a surface facing away from the wafer.

11. A method according to claim 10, wherein said at least one cover plate is removed from said treatment chamber and cleaned between substrate treatments.

12. A method according to claim 10, wherein during the thermal treatment, at least one non-watery hydrogen containing process gas is introduced into said treatment chamber, for example prior to and/or after introduction of a mixture of hydrogen and water.

13. A method according to claim 12, wherein the water content of the hydrogen/water mixture is controlled such that oxidation of the metal by the oxygen contained in the water, and a reduction of the resulting metal oxide, is substantially kept in equilibrium by the hydrogen.

14. A method according to claim 13, wherein a proportion of water in the mixture is less than 20%, and in particular about 14%.

15. A method for thermally treating semiconductor substrates having at least one structure in a process chamber by means of at least one thermal treatment cycle, wherein the structure has at least two different materials A, B, wherein said material A can form a first material a having a first component X, wherein such forming is described by a first equilibrium reaction $$A+X \Longleftrightarrow a+a'; \text{ and}$$

wherein said material B can form a second material b having a second component of a process gas Y, wherein such forming is described by a second equilibrium reaction $$B+Y \Longleftrightarrow b+b'; \text{ whereby}$$

a' and b' are optional reactants, and wherein during the thermal treatment, for at least an interval of time, at least one concentration of a component of the process gas X and/or Y, and at least a further process parameter, are chosen such that the first equilibrium reaction is displaced to the first material A and the second equilibrium reaction is displaced to the second material b, and wherein at least one concentration and/or a partial pressure of at least one component of the process gas X and/or Y is constantly changed as a function of the further process parameter.

16. A method according to claim 15, wherein at least one gas flow meter is regulated or controlled as a function of the further process parameter, and/or by means of a pump device, the total pressure or a partial pressure within the process chamber is set.

17. A method according to claim 15, wherein a second process gas having a defined composition is introduced into a volume, for example a variable volume, filled with a first process gas.

18. A method according to claim 15, wherein the time interval is within one thermal treatment cycle, or extends over several thermal treatment cycles.

19. A method according to claim 15, wherein the first equilibrium reaction substantially takes place within one thermal treatment cycle, and the second equilibrium reaction substantially takes place within another thermal treatment cycle.

20. A method according to claim 15, wherein the further process parameter is the process temperature and/or a temperature of a material a, b of the structure.

21. A method according to claim 15, wherein the further process parameter comprises a further gas concentration of a component of the process gas, the pressure of the process gas, a partial pressure of a component of a process gas, a magnetic field of pre-determined strength, a portion of UV, or the combination of the aforementioned parameters that act upon the semiconductor substrates.

22. A method according to claim 15, wherein the structure has horizontal layers with at least one material A or B, or the structure has vertical layers with at least one material A, B.

23. A method according to claim 15, wherein the materials A, B are separated by at least one material C that is different from A and B, and/or wherein the second material b forms on the material B.

24. A method according to claim 15, wherein the semiconductor substrate comprises a silicon wafer, a crystalline or amorphously grown or deposited semiconductor layer, a substrate or a layer of a IV—IV semiconductor, a II–VI semiconductor, or a III–V semiconductor.

25. A method according to claim 15, wherein the first material A comprises a metal, and the second material comprises a semiconductor B.

26. A method according to claim 25, wherein the metal of the first material A is covered by a metal oxide or metal nitride layer that comprises or forms the first material a and that can be formed, for example, by means of an equilibrium reaction.

27. A method according to claim 25, wherein the semiconductor of the second material B is at least partially covered by an oxide, nitride or oxi-nitride layer that comprises or forms the second material b, and that can be formed, for example by means of a second equilibrium reaction.

28. A method according to claim 15, wherein the first component X or the second component Y are the same or they at least comprise a same material, and/or wherein the optional reactants a', b' are the same or at least comprise the same material and/or wherein the first component X and the second component Y comprise water and/or wherein the reactants a', b' comprise hydrogen, and/or wherein the first and/or second component X, Y comprises a mixture of water and hydrogen or a mixture of water and oxygen.

29. A method according to claim 15, wherein the first and/or second component X, Y comprises a first mixture of water and hydrogen or a second mixture of water and oxygen, and wherein during the thermal treatment, the first and/or the second component X, Y is transferred from the first mixture into the second mixture, or vice versa.

30. A method according to claim 15, wherein at least the material A and/or the second material b comprises a protection layer that is formed and/or maintained by means of a protection layer-forming reactive process gas component during the thermal treatment, and wherein said protection layer makes it possible, at least for a short time, to process the semiconductor substrate in parameter areas with regard to the concentration of the process gases and at least one further parameter, preferably the temperature of the semiconductor substrate, In which the equilibrium reaction is displaced to the first material a and/or to the second material B.

31. A method according to claim 30, wherein the process gas comprises ammonia, at least during part of the thermal treatment, and/or wherein the protection-layer-forming reactive process gas component comprises ammonia.

32. A method according to claim 15, wherein at least one of the materials A, B or the materials a, b comprises tungsten, molybdenum, platinum, iridium, copper and/or the oxides or nitrides thereof, such as tungsten oxide and/or tungsten nitride.

33. A method according to claim 15, wherein the thermal treatment is carried out in a process chamber of a rapid thermal processing unit, which is, for example, temperature-calibrated in a temperature range of between 930 and 950° C., with the temperature calibration making use of the layer grown from a tungsten nitride layer in ammonia.

34. A method according to claim 15, wherein the process chamber comprises at least one covering device disposed between the semiconductor substrate and at least one process chamber wall for at least partially covering the process chamber wall.

* * * * *

UNITED STATES PATENT AND TRADEMARK OFFICE
CERTIFICATE OF CORRECTION

| | | |
|---|---|---|
| PATENT NO. | : 7,151,060 B2 | Page 1 of 1 |
| APPLICATION NO. | : 10/524871 | |
| DATED | : December 19, 2006 | |
| INVENTOR(S) | : Georg Roters et al. | |

Figure 10:
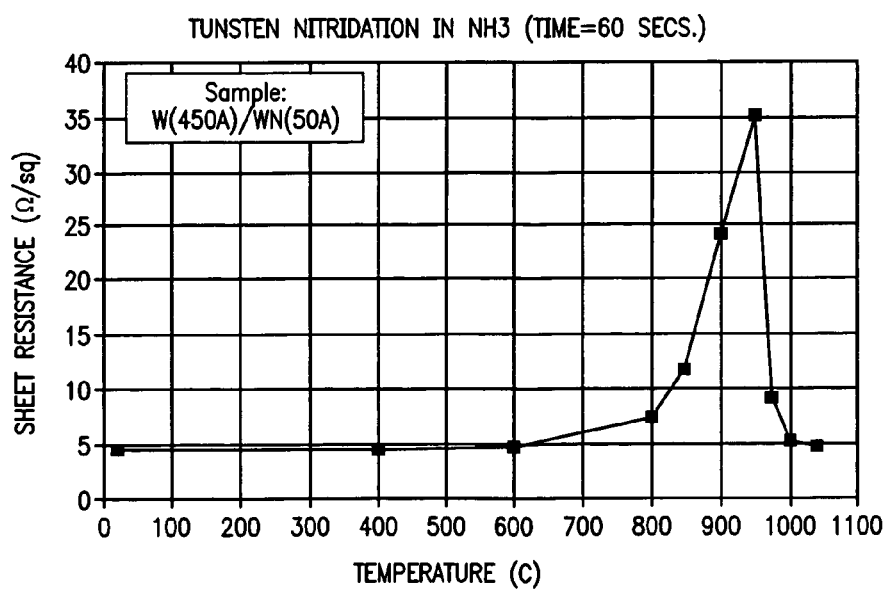
FIG. 10 shows the layer resistance of a tungsten nitride layer as a function of the temperature, whereby in pure ammonia, for 60 secs, a 45 nm thick tungsten layer on silicon was processed.

It is certified that error appears in the above-identified patent and that said Letters Patent is hereby corrected as shown below:

In the Drawings:
Figure 10, "Tunsten" should be --Tungsten--

Signed and Sealed this

Twenty-fourth Day of July, 2007

JON W. DUDAS
*Director of the United States Patent and Trademark Office*